United States Patent [19]
Tokuda

[11] Patent Number: 5,812,242
[45] Date of Patent: Sep. 22, 1998

[54] PROJECTION EXPOSURE APPARATUS INCLUDING A TEMPERATURE CONTROL SYSTEM FOR THE LENS ELEMENTS OF THE OPTICAL SYSTEM

[75] Inventor: Noriaki Tokuda, Kawasaki, Japan

[73] Assignee: Nikon Corporation, Tokyo, Japan

[21] Appl. No.: 724,216

[22] Filed: Oct. 1, 1996

[30] Foreign Application Priority Data

Oct. 3, 1995 [JP] Japan ................................ 7-279783

[51] Int. Cl.$^6$ ........................... G03B 27/42; G03B 27/54
[52] U.S. Cl. ................... 355/30; 355/53; 355/67
[58] Field of Search ................. 355/30, 52, 53, 355/77

[56] References Cited

U.S. PATENT DOCUMENTS

| | | | |
|---|---|---|---|
| 4,825,247 | 4/1989 | Kemi et al. | 355/55 |
| 4,989,031 | 1/1991 | Kamiya | 355/30 |
| 5,270,771 | 12/1993 | Sato | 355/53 |
| 5,576,895 | 11/1996 | Ikeda | 359/811 |
| 5,633,698 | 5/1997 | Imai | 355/72 |
| 5,636,000 | 6/1997 | Ushida et al. | 355/30 |
| 5,638,223 | 6/1997 | Ikeda | 359/827 |

FOREIGN PATENT DOCUMENTS

A-60-122951  7/1985  Japan.

*Primary Examiner*—R. L. Moses
*Assistant Examiner*—Shival Virmani
*Attorney, Agent, or Firm*—Oliff & Berridge, PLC

[57] ABSTRACT

A projection exposure apparatus according to the present invention (in particular, an excimer stepper) includes a projection optical system, which may include a lens element of synthetic quartz and a lens element of fluorite. The synthetic quartz lens element is temperature-controlled by a first temperature controller with a degree of accuracy of ±0.01° C., for example. The fluorite lens element is temperature-controlled by a second temperature controller with a degree of accuracy of ±0.005° C., for example. Therefore, even if the projection optical system includes lens elements with different coefficients of thermal expansion, temperature control can be made with accuracy suitable for each of the elements. Consequently, the apparatus is not enlarged. In addition, with an exposure light source of even short wavelength, it is possible to attain good imaging characteristics.

15 Claims, 2 Drawing Sheets

PROJECTION EXPOSURE APPARATUS INCLUDING A TEMPERATURE CONTROL SYSTEM FOR THE LENS ELEMENTS OF THE OPTICAL SYSTEM

BACKGROUND OF THE INVENTION

1. Field of the Invention

The present invention relates to projection exposure apparatus, and particularly to projection exposure apparatus which can temperature-control a projection optical system.

2. Description of the Related Art

A reduction projection exposure apparatus is generally known as an exposure apparatus for use in the process of photolithography for making a semiconductor integrated circuit, a liquid crystal display element, or the like. This apparatus reduces, by predetermined magnifications through a projection optical system, a circuit pattern formed on a reticle (mask) to project it onto a photosensitive substrate such as a wafer, which is coated with photosensitive material (photoresist).

The substrate is placed on a movable stage, which can be positioned three-dimensionally along X, Y and Z axes. The stage is positioned in a predetermined exposure position, where it has an imaging relationship with the reticle, on which the pattern has been formed. By illuminating the mask with the exposure light from a illumination optical system, the pattern image on the reticle is projected through the projection optical system onto the substrate.

Generally, in a projection exposure apparatus of this type, a projection optical system and a stage system are housed in a thermal chamber, which is controlled to a constant temperature to stabilize the positioning accuracy, the imaging condition, etc. As the integration of semiconductor integrated circuits has been improved, it has been demanded that these systems be higher in accuracy or precision and stability. In particular, with regard to the imaging condition stability, an exposure apparatus is known in which only the projecting lens system is temperature-controlled by a temperature control system other than the thermal chamber for the whole apparatus. For example, Japanese Patent application Laid-Open No.60-122951 discloses making, for stable imaging characteristics, temperature-controlled fluid flow along a wall of the member which holds a projection optical system in it.

The imaging condition of a projection optical system is changed by the heat reserve due to the absorption of illumination light by the system. The special temperature control system mentioned above for a projecting lens system can efficiently remove this heat to stabilize the imaging condition.

In recent years, light in the deep-UV (ultraviolet rays) zone has been used in excimer laser steppers for high accuracy projection exposure. The projection optical system of such a stepper includes lens elements made of material transparent even in this wavelength zone. The material may specifically be synthetic quartz ($SiO_2$) and fluoride crystal such as fluorite ($CaF_2$).

In a deep-UV projection optical system of this type, the absorption of illumination light is almost negligible for the material (bulk material) of the lens elements, which constitute the system. Illumination light may, however, be absorbed by the antireflection optical film with which both surfaces of the elements are coated. It is known that the resultant heat generation, or temperature change would much larger affect the fluorite lens elements than the synthetic quartz elements. This is because the coefficient of thermal expansion at ordinary temperature of synthetic quartz is about 0.5 ppm or lower per centigrade (°C.), while that of fluorite is as high as about 20 ppm. In consideration of such material characteristics of projection optical systems, the control accuracy of the lens temperature control systems in practical use is about ±0.01° C.

To improve the throughput of exposure apparatus, the power of the exposure light sources will no doubt increase, resulting in a larger quantity of heat generated in the projecting lenses. Therefore, considering the current level of imaging condition stability, or that a higher level of imaging condition stability will be demanded, it will be difficult to maintain the current or a higher degree of temperature control accuracy by means of a single temperature control system like the conventional system. To achieve this, it is unavoidable for the apparatus to be larger and costlier. This is because the temperature control accuracy of the temperature controllers repugnant to the load capacity thereof.

SUMMARY OF THE INVENTION

In such circumstances, it is therefore an object to provide a cheap projection exposure apparatus in which the projection optical system can be temperature-controlled with high accuracy without necessity to enlarge the apparatus.

Provided according to the invention is a projection exposure apparatus for exposing a photosensitive substrate with a pattern formed on a mask, which comprises:

an illumination system for illuminating the mask;

a projection optical system for projecting the pattern onto the photosensitive substrate, the projecting system having at least two zones to be temperature-controlled; and at least two temperature control systems each for independently controlling a temperature of one of the zones of the projecting system.

It is preferable that these temperature control systems have different degrees of temperature control accuracy. In such a case, if the projection optical system includes lens elements of different materials, or if the zones of this system need different degrees of temperature control accuracy, each lens element or each zone can be temperature-controlled with the respectively required degrees of accuracy.

If the lens element/s in at least one of the zones of the projection optical system is/are made of material different from that/those for the other zone/s, this projection exposure apparatus is very effective. For example, if the projection optical system includes a lens element made of synthetic quartz and a lens element made of fluorite, the synthetic quartz and fluorite lens elements can be temperature-controlled by two temperature control systems respectively. This makes it possible to temperature-control with high accuracy the second zone for fluorite of the projection optical system, which needs higher temperature control than the first zone for synthetic quartz. In addition, it is sufficient that the first zone is temperature-controlled with the required accuracy.

The temperature controllers may each include a temperature control jacket fitted on the projection optical system, and a temperature controller for controlling the temperature of the fluid flowing through the jacket. By controlling the temperature of the fluid flowing through each of the jackets with the associated controller, it is possible to control the temperature of each of the zones of the projection optical system.

The projection exposure apparatus of the invention is very effective for an excimer stepper. The invention can also be applied to step-and-scan type scanning projection exposure apparatus.

DETAILED DESCRIPTION OF THE EMBODIMENT

Preferred embodiments of this invention will be clearly understood from the following description by referring to the accompanying drawings.

Figure 1:
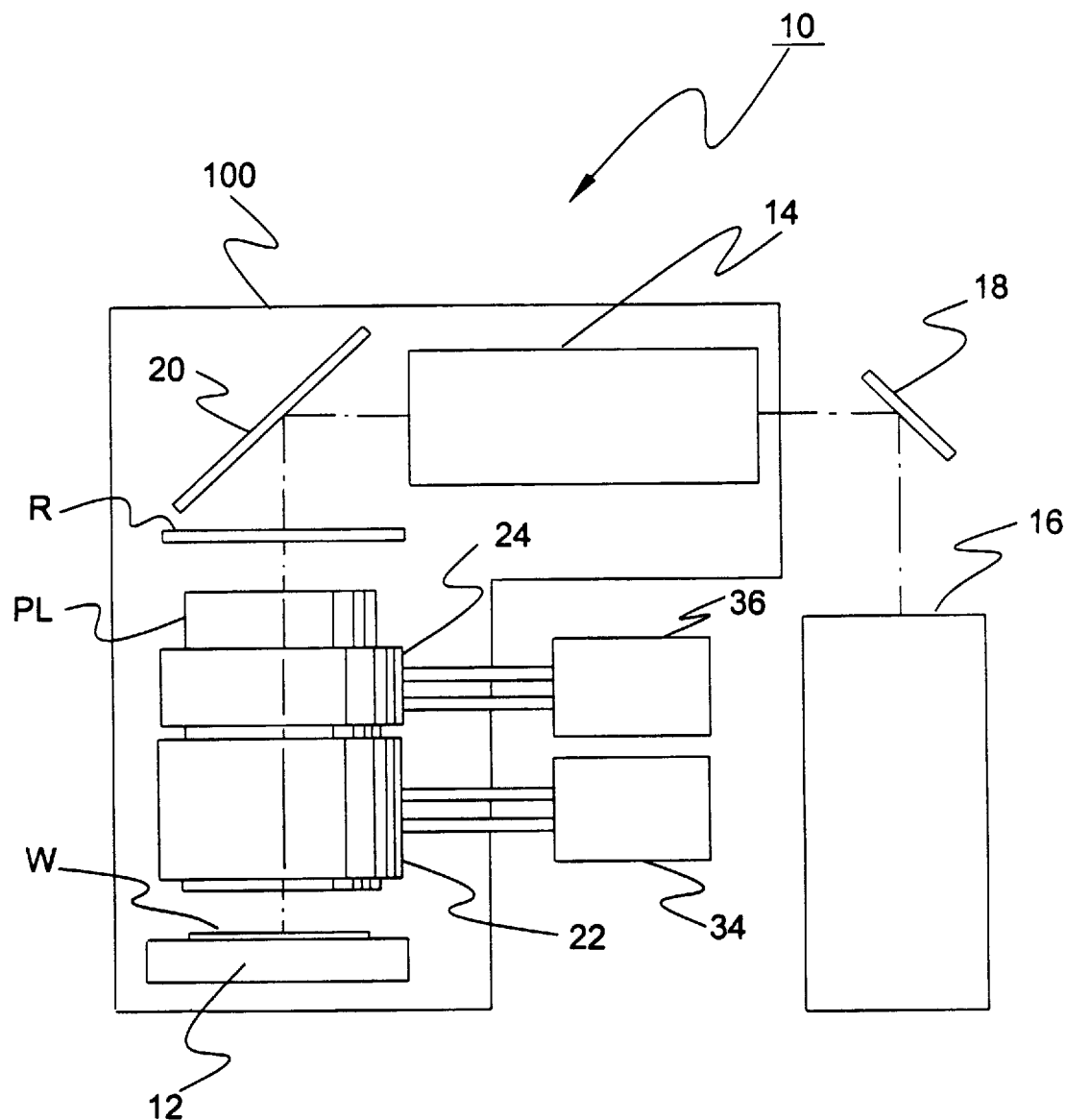
FIG. 1 is a diagrammatic elevational view of a projection exposure apparatus according to the embodiment.

The projection exposure apparatus (excimer laser stepper) 10 shown in FIG. 1 includes a wafer stage 12, on which a wafer W as a photosensitive substrate is mounted, a projection optical system PL positioned over the stage 12, and a reticle R as a mask positioned over the system PL. The apparatus 10 also includes a illumination optical system 14 and an exposure light source 16, which constitute an illumination system for illuminating the reticle R with exposure light. In this embodiment, the source 16 is an excimer laser for emitting a laser beam of far ultraviolet wavelength (KrF: wavelength of 248 nm or ArF: wavelength of 193 nm) as exposure light.

The wafer stage 12 can move two-dimensionally on a horizontal plane along X-axis parallel to the sheet of FIG. 1 and Y-axis perpendicular to X-axis, and vertically along Z-axis. The upper surface of the wafer W is coated with photosensitive material (photoresist). The reticle R is held on a reticle stage (not shown), and has a pattern formed on its lower surface.

The optical systems PL and 14, the wafer stage 12, etc. are housed in a thermal chamber 100, which is controlled at a constant temperature (for example, ±0.1° C. around a set temperature) for accurate positioning and stable imaging.

Figure 2:
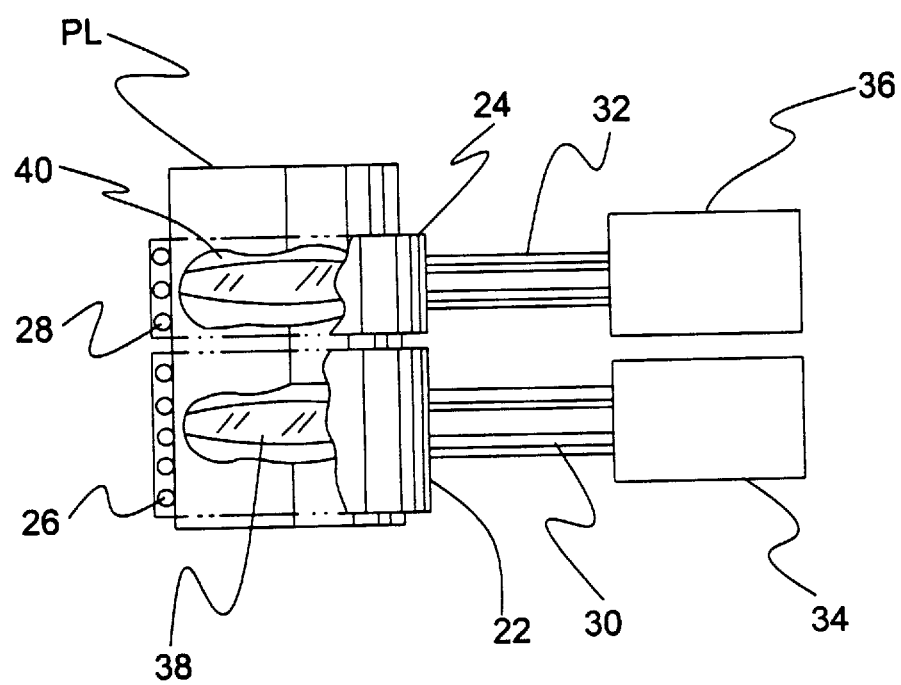
FIG. 2 is part of FIG. 1, which is partially broken.

The projection optical system PL includes lens elements spaced at predetermined intervals on a common vertical optical axis. The elements are held in a lens barrel. The system PL is fitted with first and second temperature control jackets 22 and 24 on its periphery. As shown in FIG. 2, the jackets 22 and 24 include pipes 26 and 28 respectively in them, through each of which temperature-controlled fluid (gas or liquid) can flow. The pipes 26 and 28, which may spirally extend, are connected through heat-insulated tubes 30 and 32 to first and second temperature controllers 34 and 36 respectively. The controllers 34 and 36 include heaters, coolers and control systems (not shown) for the heaters and coolers. The controllers 34 and 36 each control, within a predetermined range of temperature control accuracy or precision, the temperature of the fluid for flowing through the associated pipe 26 or 28 so that the temperature is a set point. In this embodiment, the temperature-controlled fluid is inactive liquid, which may be fluorine-based liquid.

The lens elements of the projection optical system PL may be made of synthetic quartz or fluorite. As typically shown in FIG. 2, the first temperature control jacket 22 covers a first portion of the system PL, in which synthetic quartz lens elements 38 are mainly used (represented by a convex lens in FIG. 2). The second jacket 24 covers a second portion of the system PL, in which fluorite lens elements 40 are mainly used (similarly represented by a convex lens). The lens elements are coated with antireflection film on their both surfaces.

As stated above, in the projection optical system PL of such structure, there is a need of more accurate temperature control for the fluorite lens elements 40. Therefore, it is necessary for the temperature controller 36 to be more accurate in control than the temperature controller 34. In this embodiment, the temperature control accuracy of the controller 34 is ±0.01° C., while that of the controller 36 is ±0.005° C.

The operation of the apparatus 10 is explained below.

First, the wafer stage 12 is positioned three-dimensionally in X, Y and Z directions by a control system (not shown). When the exposure light source 16 is turned on, it emits a beam of exposure light (KrF: 248 nm or ArF: 193 nm). The mirror 18 reflects the beam toward the illumination optical system 14, which enlarges the reflected beam in diameter and uniforms it in illuminance. The beam from the system 14 is reflected downward by the mirror 20 and illuminates the reticle R. Consequently, the pattern on the reticle R is projected through the projection optical system PL onto the wafer W, which has been coated with the photosensitive material (photoresist), so that the wafer W is exposed.

If such exposure is made for each stepping of the wafer stage 12, the lens elements 38 and 40 absorb exposure light. The resultant heat generation, or temperature change thermally expands the elements 38 and 40. The fluorite lens elements 40 are much higher in expansion coefficient than the synthetic quartz lens elements 38. In this embodiment, the second portion of the projection optical system PL for the elements 40 is controlled by the temperature controller 36 at the temperature control accuracy of ±0.005° C. On the other hand, the first portion for the elements 38 is controlled by the controller 34 at the accuracy of ±0.01° C. Therefore, the system PL can be controlled accurately or precisely and finely or locally in accordance with the materials of its portions, and accordingly with the temperature control accuracy required by each of the portions.

Therefore, the absorption of exposure light hardly changes the imaging characteristics such as the magnification and distortion of the projection optical system PL, so that the characteristics are stable. In addition, the heat load on the temperature controllers 34 and 36 is shared or divided by them. Consequently, it is possible for the temperature control system to be minimum in capacity. As a result, it is possible to keep the apparatus from being larger and costlier than required.

In this embodiment, as apparent from the foregoing, the first temperature control jacket 22, tube 30 and first temperature controller 34 constitute a first temperature control system for controlling the temperature of the first portion of the projection optical system, which includes the synthetic quartz lens elements. Likewise, the second jacket 24, tube 32 and second controller 36 constitute a second temperature control system for controlling the temperature of the second portion of the system, which includes the fluorite lens elements.

In the above embodiment, the two temperature control systems are used which differ in accuracy, but the present invention is not limited to this. For example, if the lens elements constituting the projection optical system were divided into two fluorite sets and one synthetic quartz set, three temperature control systems might be provided for the respective sets. This enables a faithful temperature control system to be constituted by designing the lens element material combination in the projection optical system.

In the above embodiment, the light source is an excimer laser. The invention may also be applied suitably to a case where light of far ultraviolet wavelength is used, which may be the fourth or fifth harmonic of a YAG laser.

In the above embodiment, the temperature of the fluid for temperature control is controlled in each of the temperature controllers. As occasion demands, the temperature control jackets may be fitted with temperature sensors or the like in it for directly detecting the temperatures of the projection optical system.

For temperature control at a degree of accuracy as high as ±0.005° C., it is preferable to thermally insulate the temperature control jackets themselves or take other measures. This makes the jackets less affected by the temperature control in the thermal chamber at a degree of accuracy of even ±0.1° C.

In the above embodiment, the projection exposure apparatus is an excimer laser stepper, but the invention is not limited to such step-and-repeat exposure type projection exposure apparatus. The invention may be applied to any projection exposure apparatus including a scanning type projection exposure apparatus such as a step-and-scan type projection exposure apparatus and batch (full field) type projection exposure apparatus.

According to the invention, as explained hereinbefore, in a case where the projection optical system of a projection exposure apparatus includes lens elements of different materials, a case where portions of this system need different degrees of temperature control accuracy, and other cases, it is possible to temperature-control the portions with the respectively required degrees of accuracy. Therefore, the projection optical system can be finely temperature-controlled. In addition, the share of heat load on each of the temperature control systems can be small in comparison with the total heat load on the single system of the conventional apparatus. This can prevent the apparatus from being larger and costlier than required. Therefore, good imaging characteristics can be attained by even an excimer stepper or other projection exposure apparatus with an exposure light source of short wavelength.

What is claimed is:

1. A projection exposure apparatus for exposing a photosensitive substrate with a pattern formed on a mask, the apparatus comprising:

an illumination system which illuminates the mask;

a projection optical system which projects the pattern of the mask onto the substrate, the projection optical system having at least two zones to be temperature-controlled, each of the at least two zones including at least one lens element; and at least two temperature control systems each of which independently controls a temperature of a separate one of the zones of the projection optical system.

2. A projection exposure apparatus according to claim 1, wherein the at least two temperature control systems have different degrees of temperature control accuracy.

3. A projection exposure apparatus according to claim 2, wherein the zones of the projection optical system each include a lens element made of material different from the materials for the other zones.

4. A projection exposure apparatus according to claim 2, wherein the at least two temperature control systems are a first temperature control system and a second temperature control system, the projection optical system including a first lens element made of synthetic quartz and a second lens element made of fluorite, the first and second temperature control systems temperature-controlling the first and second elements respectively.

5. A projection exposure apparatus according to claim 4, wherein the second temperature control system has a higher degree of temperature control accuracy than the first temperature control system.

6. A projection exposure apparatus according to claim 1, wherein the at least two temperature control systems each include a temperature control jacket fitted on the projection optical system, and a temperature controller for controlling the temperature of the fluid flowing through the jacket.

7. A projection exposure apparatus according to claim 6, wherein the temperature control jacket has a temperature sensor fitted therein, such that the temperature of the fluid flowing through the jacket is controlled on the basis of the temperature measured by the sensor.

8. A projection exposure apparatus according to claim 1, wherein the illumination system includes an excimer laser as a light source.

9. A projection exposure apparatus according to claim 1, which is one of a step and repeat type projection exposure apparatus and a scanning type projection exposure apparatus.

10. A projection exposure apparatus according to claim 4, wherein the first lens element made of synthetic quartz and the second lens element made of fluorite are temperature-controlled independently by the first temperature control system and the second temperature control system, respectively, so that imaging characteristics of the projection optical system are corrected.

11. An exposure method for transferring a pattern formed on a mask onto a substrate through a plurality of optical elements, comprising:

detecting information on a temperature of each of the plurality of optical elements; and controlling independently the temperature of each of the plurality of optical elements based on the detected information.

12. An exposure method according to claim 11, wherein at least two optical elements of the plurality of optical elements have different coefficients of thermal expansion.

13. An exposure method according to claim 12, wherein the at least two optical elements are controlled with different degrees of temperature control accuracy based on a coefficient of thermal expansion.

14. A method for temperature controlling a projection optical system having a plurality of optical elements, at least two of the plurality of optical elements being made of different materials, comprising:

providing the projection optical system with a separate temperature controlling device for each one of the at least two optical elements; and independently controlling the temperature controlling device for each one of the at least two optical elements.

15. A method according to claim 14, wherein the plurality of optical elements include an optical element made of synthetic quartz and an optical element made of fluorite.

* * * * *